(12) United States Patent
Yamakawa et al.

(10) Patent No.: US 10,516,095 B2
(45) Date of Patent: Dec. 24, 2019

(54) MAGNETIC MEMORY DEVICE

(71) Applicant: TOSHIBA MEMORY CORPORATION, Minato-ku, Tokyo (JP)

(72) Inventors: Koji Yamakawa, Yokkaichi Mie (JP); Koji Ueda, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/918,235

(22) Filed: Mar. 12, 2018

(65) Prior Publication Data
US 2019/0088855 A1 Mar. 21, 2019

(30) Foreign Application Priority Data
Sep. 21, 2017 (JP) .................. 2017-181613

(51) Int. Cl.
| | |
|---|---|
| *H01L 43/08* | (2006.01) |
| *H01L 43/10* | (2006.01) |
| *G11C 11/16* | (2006.01) |
| *H01L 43/02* | (2006.01) |
| *H01F 10/32* | (2006.01) |
| *H01L 43/12* | (2006.01) |
| *H01L 27/22* | (2006.01) |

(52) U.S. Cl.
CPC ............ *H01L 43/02* (2013.01); *H01F 10/329* (2013.01); *H01F 10/3254* (2013.01); *H01F 10/3272* (2013.01); *H01L 43/08* (2013.01); *H01L 43/10* (2013.01); *G11C 11/161* (2013.01); *G11C 11/1675* (2013.01); *H01L 27/228* (2013.01); *H01L 43/12* (2013.01)

(58) Field of Classification Search
CPC ......... H01L 43/02; H01L 43/12; H01L 43/10; H01L 43/08; H01L 27/228; H01F 20/329; H01F 20/3272; H01F 10/3254; G11C 11/161
See application file for complete search history.

(56) References Cited

U.S. PATENT DOCUMENTS

| | | |
|---|---|---|
| 8,854,876 B2 | 10/2014 | Uchida et al. |
| 9,231,194 B2 | 1/2016 | Kuo et al. |
| 9,362,489 B1 | 6/2016 | Guo |

(Continued)

FOREIGN PATENT DOCUMENTS

| | | |
|---|---|---|
| JP | 2012244031 A | 12/2012 |
| JP | 2014179447 A | 9/2014 |

(Continued)

*Primary Examiner* — Galina G Yushina
(74) *Attorney, Agent, or Firm* — Holtz, Holtz & Volek PC

(57) ABSTRACT

According to one embodiment, a magnetic memory device includes a lower region, and a stacked structure provided on the lower region, wherein the stacked structure includes a conductive oxide layer containing boron (B), a first magnetic layer provided between the lower region and the conductive oxide layer, having a variable magnetization direction, and containing iron (Fe) and boron (B), a second magnetic layer provided between the lower region and the first magnetic layer, having a fixed magnetization direction, and containing iron (Fe) and boron (B), and a nonmagnetic layer provided between the first magnetic layer and the second magnetic layer.

12 Claims, 12 Drawing Sheets

(56) References Cited

U.S. PATENT DOCUMENTS

| | | | |
|---|---|---|---|
| 2008/0096376 A1* | 4/2008 | Li | H01L 31/022466 438/597 |
| 2011/0031569 A1* | 2/2011 | Watts | B82Y 25/00 257/421 |
| 2014/0242418 A1* | 8/2014 | Shukh | G11C 11/161 428/811.1 |
| 2014/0264669 A1 | 9/2014 | Nakayama et al. | |
| 2014/0273341 A1* | 9/2014 | Van Duren | H01L 21/30604 438/104 |
| 2015/0001654 A1* | 1/2015 | Sandhu | H01L 43/02 257/421 |
| 2015/0325783 A1* | 11/2015 | Wang | H01F 10/3286 257/421 |
| 2016/0099406 A1 | 4/2016 | Nishiyama et al. | |
| 2017/0200884 A1 | 7/2017 | Oguz et al. | |

FOREIGN PATENT DOCUMENTS

| | | |
|---|---|---|
| JP | 2016518021 A | 6/2016 |
| TW | 201614882 A | 4/2016 |

* cited by examiner

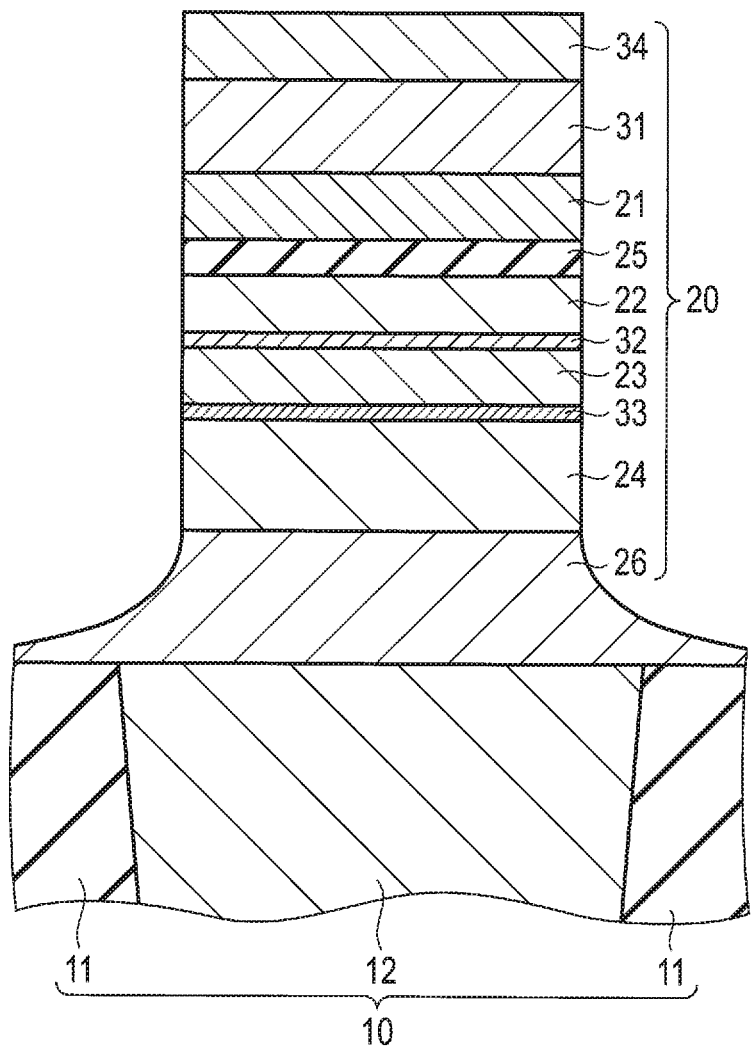
F I G. 3

MAGNETIC MEMORY DEVICE

CROSS-REFERENCE TO RELATED APPLICATIONS

This application is based upon and claims the benefit of priority from Japanese Patent Application No. 2017-181613, filed Sep. 21, 2017, the entire contents of which are incorporated herein by reference.

FIELD

Embodiments described herein relate generally to a magnetic memory device.

BACKGROUND

A magnetic memory device (semiconductor integrated circuit device) in which a magnetoresistive element and a MOS transistor are integrated on a semiconductor substrate has been suggested.

In general, the magnetoresistive element comprises a structure in which a tunnel barrier layer is provided between a storage layer and a reference layer.

In order to obtain an excellent magnetoresistive element, it is important to prevent degradation in the process for forming the element and to improve the crystallinity of magnetic layers such as a storage layer and a reference layer.

BRIEF DESCRIPTION OF THE DRAWINGS

FIG. 3 is a cross-sectional view schematically showing a part of the method for manufacturing the magnetic memory device according to the first embodiment.

DETAILED DESCRIPTION

In general, according to one embodiment, a magnetic memory device includes: a lower region; and a stacked structure provided on the lower region, wherein The stacked structure includes: a conductive oxide layer containing boron (B); a first magnetic layer provided between the lower region and the conductive oxide layer, having a variable magnetization direction and containing iron (Fe) and boron (B); a second magnetic layer provided between the lower region and the first magnetic layer, having a fixed magnetization direction and containing iron (Fe) and boron (B); and a nonmagnetic layer provided between the first magnetic layer and the second magnetic layer.

Embodiments will be described hereinafter with reference to the accompanying drawings.

(Embodiment 1)

Figure 1:
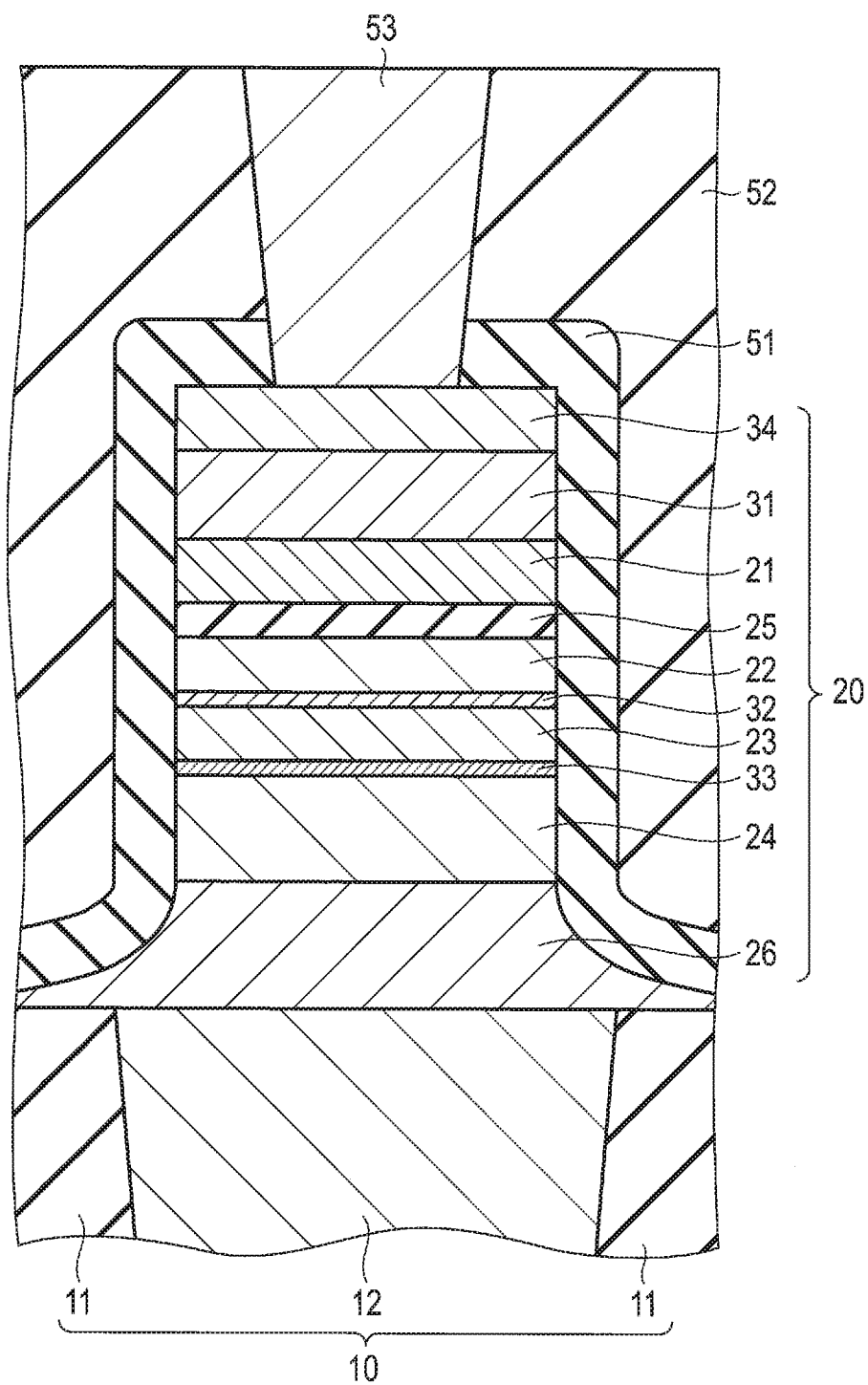
FIG. 1 is a cross-sectional view schematically showing the structure of a magnetic memory device according to a first embodiment.

FIG. 1 is a cross-sectional view schematically showing the structure of a magnetic memory device (semiconductor integrated circuit device) according to a first embodiment.

In FIG. 1, a lower region 10 includes a semiconductor substrate (not shown), a MOS transistor (not shown), an interlayer insulating film 11, a bottom electrode 12, etc. The bottom electrode 12 is provided in the interlayer insulating film 11, and is connected to one of the source and drain of the MOS transistor.

A stacked structure 20 for a magnetoresistive element is provided on the lower region 10. The magnetoresistive element is also called a magnetic tunnel junction (MTJ) element.

The stacked structure 20 includes a first magnetic layer 21, a second magnetic layer 22, a third magnetic layer 23, a fourth magnetic layer 24, a nonmagnetic layer 25, an under layer 26, a conductive oxide layer 31, an intermediate layer 32, an intermediate layer 33 and a conductive contact layer 34.

Specifically, the first magnetic layer 21 is provided between the lower region 10 and the conductive oxide layer 31. The second magnetic layer 22 is provided between the lower region 10 and the first magnetic layer 21. The nonmagnetic layer 25 is provided between the first magnetic layer 21 and the second magnetic layer 22. The third magnetic layer 23 is provided between the lower region 10 and the second magnetic layer 22. The fourth magnetic layer 24 is provided between the lower region 10 and the third magnetic layer 23. The under layer 26 is provided between the lower region 10 and the fourth magnetic layer 24. The conductive oxide layer 31 is provided between the first magnetic layer 21 and the conductive contact layer 34. The intermediate layer 32 is provided between the second magnetic layer 22 and the third magnetic layer 23. The intermediate layer 33 is provided between the third magnetic layer 23 and the fourth magnetic layer 24.

The first magnetic layer 21 is used as the storage layer of the magnetoresistive element and has a variable magnetization direction. The first magnetic layer 21 contains at least iron (Fe) and boron (B). The first magnetic layer 21 may contain cobalt (Co) in addition to iron (Fe) and boron (B). In the present embodiment, the first magnetic layer 21 is formed of CoFeB.

The second magnetic layer 22 is used as a part of the reference layer of the magnetoresistive element and has a fixed magnetization direction. The second magnetic layer 22 contains at least iron (Fe) and boron (B). The second magnetic layer 22 may contain cobalt (Co) in addition to iron (Fe) and boron (B). In the present embodiment, the second magnetic layer 22 is formed of CoFeB.

The magnetization direction is variable means that the magnetization direction changes for a predetermined write current. The magnetization direction is fixed means that the magnetization direction does not change for a predetermined write current.

The third magnetic layer 23 is used as a part of the reference layer of the magnetoresistive element and has a fixed magnetization direction parallel to the magnetization direction of the second magnetic layer 22. The third magnetic layer 23 contains cobalt (Co) and at least one element selected from platinum (Pt), nickel (Ni) and palladium (Pd). Specifically, the third magnetic layer 23 is formed of a multilayer of Co/Pt, Co/Ni, Co/Pd, etc.

The fourth magnetic layer 24 is used as the shift canceling layer of the magnetoresistive element and has a fixed magnetization direction antiparallel to the magnetization direction of the second magnetic layer 22. The fourth magnetic layer 24 contains cobalt (Co) and at least one element selected from platinum (Pt), nickel (Ni) and palladium (Pd). Specifically, the fourth magnetic layer 24 is formed of a multilayer of Co/Pt, Co/Ni, Co/Pd, etc. By providing the fourth magnetic layer 24 as the shift canceling layer, it is possible to cancel the magnetic field applied from the reference layer (the second magnetic layer 22 and the third magnetic layer 23) to the storage layer (the first magnetic layer 21).

The nonmagnetic layer 25 has insulating properties and is used as the tunnel barrier layer of the magnetoresistive element. The nonmagnetic layer 25 contains magnesium (Mg) and oxygen (O). Specifically, the nonmagnetic layer 25 is formed of MgO.

The under layer 26 is the bottom layer of the stacked structure 20 and is connected to the bottom electrode 12. The under layer 26 is formed of, for example, ruthenium (Ru), tantalum (Ta) or tungsten (W).

The conductive oxide layer 31 is used as the cap layer of the magnetoresistive element and is formed of a conductive oxide containing boron (B). Specifically, the conductive oxide layer 31 is formed of a conductive metal oxide containing boron (B). For example, the following materials can be used for the conductive oxide layer 31.

Firstly, a material containing oxygen (O), boron (B) and at least one metal element selected from indium (In), zinc (Zn) and tin (Sn) can be used for the conductive oxide layer 31. Specifically, it is possible to use indium tin oxide (ITO) containing boron (B) or indium gallium zinc oxide (IGZO) containing boron (B) for the conductive oxide layer 31.

Secondly, a material containing oxygen (O), boron (B) and at least one metal element selected from transition metal elements and rare earth metal elements can be used for the conductive oxide layer 31. In this case, the material is preferably doped with a metal element. When the main component of the conductive oxide layer 31 is a transition metal element, for example, niobium (Nb), tantalum (Ta), tungsten (W) and lithium (Li) can be used for the doping metal element. For example, titanium oxide doped with Nb, Ta, N or Li can be used for the conductive oxide layer 31. When the main component of the conductive oxide layer 31 is a rare earth metal element, for example, indium (In) and lithium (Li) can be used for the doping metal element. For example, gadolinium (Gd) oxide doped with In or Li and terbium (Tb) oxide doped with In or Li can be used for the conductive oxide layer 31. Alternatively, an oxide layer having oxygen deficiency may be used for the conductive oxide layer 31 (in other words, the conductive oxide layer containing at least one metal element selected from transition metal elements and rare earth metal elements). In this case, the composition ratio of the oxygen contained in the conductive oxide layer 31 is less than stoichiometry. For example, a conductive oxide layer having oxygen deficiency can be formed by reducing a part of oxide in a high reducible atmosphere or by forming the film in an oxygen-less environment.

The intermediate layer 32 is used as a diffusion barrier layer between the second magnetic layer 22 and the third magnetic layer 23. For example, a tantalum (Ta) layer is used for the intermediate layer 32.

The intermediate layer 33 is used as a synthetic antiferromagentic (SAF) coupling layer between the third magnetic layer 23 and the fourth magnetic layer 24. For example, a ruthenium (Ru) layer is used for the intermediate layer 33.

The conductive contact layer 34 is the top layer of the stacked structure 20 and is connected to a top electrode 53 as described later. The conductive contact layer 34 contains at least one element selected from ruthenium (Ru) and iridium (Ir). Ruthenium and iridium oxides are conductive. Thus, ruthenium and iridium are desirable for the top layer of the stacked structure 20.

The stacked structure 20 is covered with a protective insulating film 51. The protective insulating film 51 is covered with an interlayer insulating film 52. The top electrode 53 is provided in the hole formed in the protective insulating film 51 and the interlayer insulating film 52.

The above magnetoresistive element is a spin-transfer-torque (STT) magnetoresistive element having perpendicular magnetization. Thus, the first to fourth magnetic layers 21 to 24 have a magnetization direction perpendicular to their respective main surfaces.

The resistance of the stacked structure 20 for the above magnetoresistive element when the magnetization direction of the storage layer (first magnetic layer 21) is parallel to the magnetization direction of the reference layer (the second magnetic layer 22 and the third magnetic layer 23) is less than that when the magnetization direction of the storage layer is antiparallel to the magnetization direction of the reference layer. In other words, when the magnetization direction of the storage layer is parallel to the magnetization direction of the reference layer, the stacked structure 20 is in a low resistive state. When the magnetization direction of the storage layer is antiparallel to the magnetization direction of the reference layer, the stacked structure 20 is in a high resistive state. Thus, the magnetoresistive element is capable of storing binary data (0 or 1) based on the resistive state (the low resistive state or the high resistive state). The resistive state of the magnetoresistive element can be set based on the direction of write current flowing in the magnetoresistive element (stacked structure 20).

Now, this specification explains a method for manufacturing the magnetic memory device according to the present embodiment.

Figure 2:
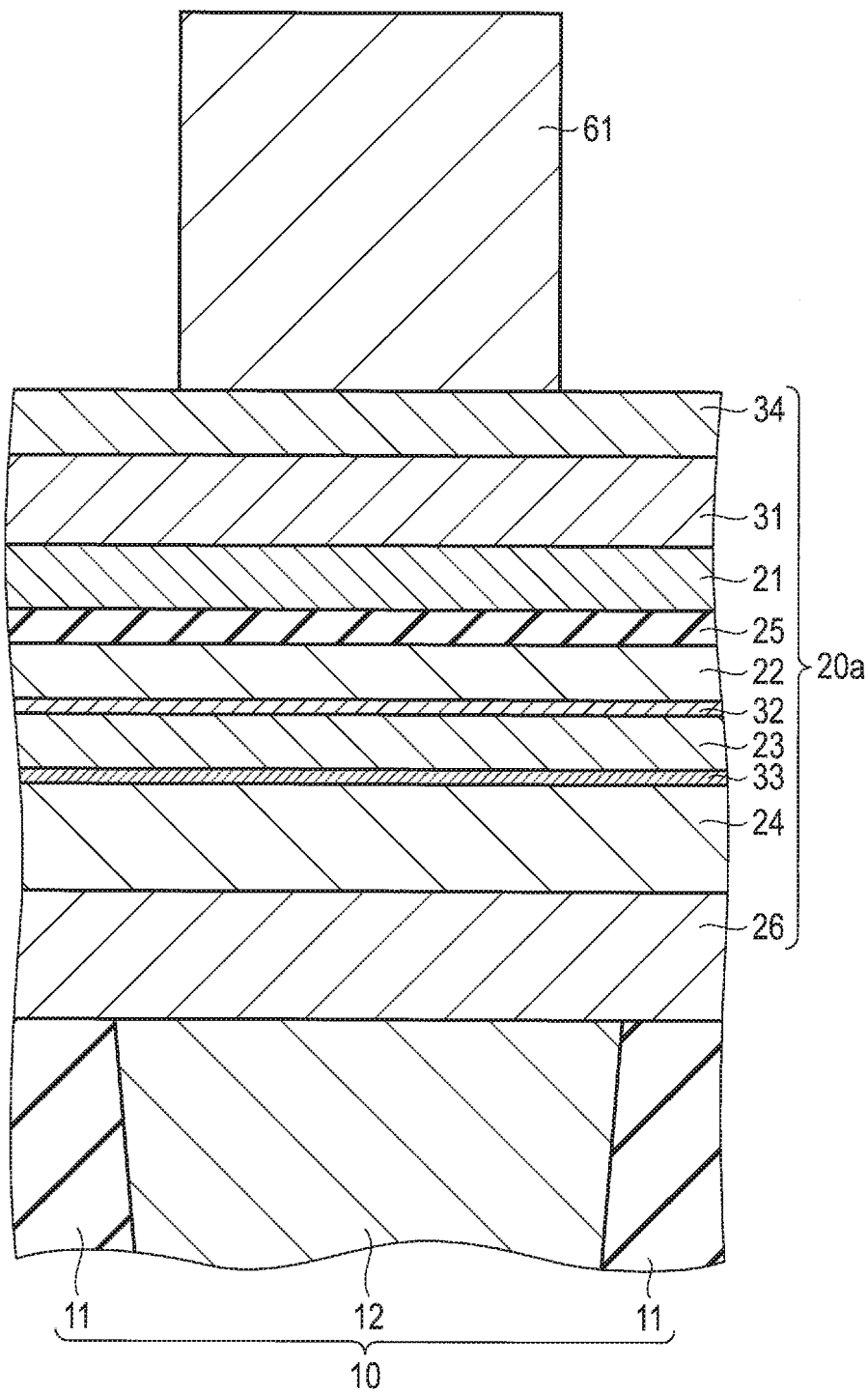
FIG. 2 is a cross-sectional view schematically showing a part of a method for manufacturing the magnetic memory device according to the first embodiment.

As shown in FIG. 2, for example, a MOS transistor (not shown), the interlayer insulating film 11 and the bottom electrode 12 are formed on a semiconductor substrate (not shown). In this way, the lower region 10 is formed.

Subsequently, a stacked film 20a for a magnetoresistive element is formed on the lower region 10. A method for forming the stacked film 20a is explained below.

The under layer 26 is formed on the lower region 10 by sputtering. For example, ruthenium (Ru), tantalum (Ta) or tungsten (W) is used for the material of the under layer 26.

Subsequently, the fourth magnetic layer 24 to be a shift canceling layer is formed on the under layer 26 by sputtering. Specifically, for example, a multilayer of Co/Pt, Co/Ni or Co/Pd is formed as the fourth magnetic layer 24. The multilayer has an approximately 10 to 15 periodic structure. An inactive gas such as argon (Ar) or krypton (Kr) is used for sputtering.

Subsequently, the intermediate layer 33 is formed on the fourth magnetic layer 24 by sputtering. Specifically, as the intermediate layer 33, a ruthenium (Ru) layer having a thickness of approximately 0.4 to 0.8 nm is formed.

Subsequently, the third magnetic layer 23 to be a part of a reference layer is formed on the intermediate layer 33 by sputtering. Specifically, for example, a multilayer of Co/Pt, Co/Ni or Co/Pd is formed as the third magnetic layer 23. The multilayer has an approximately 3 to 5 periodic structure.

Subsequently, the intermediate layer 32 is formed on the third magnetic layer 23 by sputtering. Specifically, a tantalum (Ta) layer is formed as the intermediate layer 32.

Subsequently, the second magnetic layer 22 to be a part of the reference layer is formed on the intermediate layer 32 by sputtering. Specifically, as the second magnetic layer 22, a CoFeB layer having a thickness of approximately 1 to 1.5 nm is formed.

Subsequently, the nonmagnetic layer 25 to be a tunnel barrier layer is formed on the second magnetic layer 22 by sputtering. Specifically, as the nonmagnetic layer 25, an MgO layer having a thickness of approximately 1 nm is formed.

Subsequently, the first magnetic layer 21 to be a storage layer is formed on the nonmagnetic layer 25 by sputtering. Specifically, as the first magnetic layer 21, a CoFeB layer having a thickness of approximately 1 to 1.5 nm is formed.

Subsequently, the conductive oxide layer (conductive metal oxide layer) 31 to be a cap layer is formed on the first magnetic layer 21 by sputtering. Specifically, the conductive oxide layer 31 containing at least one metal element selected from indium (In), zinc (Zn) and tin (Sn) is formed. For example, an ITO layer or IGZO layer is formed as the conductive oxide layer 31. Alternatively, a transition metal oxide layer doped with a metal element (Nb, Ta, W, Li, etc.,) or a rare earth metal oxide layer doped with a metal element (In, Li, etc.,) may be formed as the conductive oxide layer 31. The conductive oxide layer 31 may be formed with an oxide target or by reactive sputtering with a metal target.

Subsequently, heat treatment is performed. Specifically, heat treatment is performed by rapid thermal annealing (RTA) in a vacuum at a temperature of approximately 350 to 450° C. for approximately 30 to 180 seconds. By this heat treatment, for example, the first and second magnetic layers are crystallized. The boron (B) contained in the first magnetic layer 21 is diffused into the conductive oxide layer 31. As a result, the conductive oxide layer 31 contains boron (B). As the conductive oxide layer 31 is adjacent to the first magnetic layer 21, the boron (B) contained in the first magnetic layer 21 can be effectively diffused into the conductive oxide layer 31.

Subsequently, the conductive contact layer 34 is formed on the conductive oxide layer 31 containing boron (B). Specifically, a ruthenium (Ru) layer or an iridium (Ir) layer is formed as the conductive contact layer 34 by sputtering.

In the above manner, the stacked film 20a for the magnetoresistive element is formed on the lower region 10.

Subsequently, a hard mask 61 is formed on the conductive contact layer 34 of the stacked film 20a. Specifically, a hard mask film using a silicon oxide film or a silicon nitride film is formed on the conductive contact layer 34. Subsequently, a resist pattern is formed on the hard mask film. Further, the hard mask film is patterned by using the resist pattern as a mask. In this way, the hard mask 61 is formed.

Subsequently, as shown in FIG. 3, the stacked film 20a is etched by using the hard mask 61 shown in FIG. 2 as a mask. Specifically, the stacked film 20a is etched by ion beam etching (IBE). At this time, the hard mask 61 is also etched. By this process, the stacked structure 20 is formed.

Subsequently, as shown in FIG. 1, the protective insulating film 51 covering the stacked structure 20 is formed. A silicon nitride film is used for the protective insulating film 51. Subsequently, the intermediate insulating film 52 covering the protective insulating film 51 is formed. A silicon oxide film is used for the interlayer insulating film 52. Subsequently, a hole reaching the conductive contact layer 34 is formed in the protective insulating film 51 and the interlayer insulating film 52. Further, the top electrode 53 is formed in the hole. In this manner, the magnetic memory device shown in FIG. 1 is obtained.

As described above, in the present embodiment, the conductive oxide layer 31 is used as the cap layer of the stacked structure 20. In other words, in the present embodiment, the conductive oxide layer 31 is formed on the first magnetic layer 21 functioning as the storage layer. For this reason, in heat treatment, the boron (B) contained in the first magnetic layer 21 can be effectively absorbed by the conductive oxide layer 31, and thus, the crystallinity of the first magnetic layer 21 can be improved. In the conductive oxide layer 31, a predetermined element such as a metal element and oxygen are bonded tightly together. Thus, it is possible to prevent the diffusion of the predetermined element from the conductive oxide layer 31 to the first magnetic layer 21. In this way, the degradation of the first magnetic layer 21 caused by the predetermined element can be prevented. In the present embodiment, the characteristics of the first magnetic layer 21 can be improved, and a magnetoresistive element having excellent characteristics can be obtained.

In the present embodiment, as the boron (B) contained in the first magnetic layer 21 is absorbed by the conductive oxide layer 31, the amount of boron (B) diffused to the sides of the first magnetic layer 21 can be decreased. Thus, it is possible to prevent the accumulation of boron (B) near the sides of the first magnetic layer 21.

In the present embodiment, as the conductive oxide layer 31 is used as the cap layer of the stacked structure 20, it is unnecessary to form a hole in the cap layer in order to obtain electrical connection between the top electrode 53 and the first magnetic layer 21. In other words, when an insulating material layer is used as the cap layer, a hole needs to be formed in the insulating material layer in order to obtain electrical connection between the top electrode 53 and the first magnetic layer 21. In the present embodiment, the provision of such a hole is unnecessary. It is possible to assuredly and easily obtain electrical connection between the top electrode 53 and the first magnetic layer 21 via the conductive oxide layer 31.

In the present embodiment, as the conductive oxide layer 31 is used as the cap layer of the stacked structure 20, high etching resistance properties can be obtained by the conductive oxide layer 31 when the stacked structure 20 is formed by etching the stacked film 20a. Therefore, even when a part of the conductive oxide layer 31 (for example, the upper corner portion) is exposed at the time of etching, the first magnetic layer 21 etc., can be protected by the conductive oxide layer 31 having high etching resistance properties. Thus, the stacked structure 20 can be appropriately formed. In particular, in IBE, this effect remarkable since the etching speed of conductive oxide is less than that of metal.

In the present embodiment, the conductive contact layer 34 containing at least one element selected from ruthenium (Ru) and iridium (Ir) is provided on the conductive oxide layer 31. Ruthenium and iridium oxides are conductive. Thus even when the surface of the conductive contact layer 34 is exposed and oxidized, the conductivity of the conductive contact layer 34 can be maintained. In this manner, electrical connection between the top electrode 53 and the first magnetic layer 21 can be assuredly obtained.

(Embodiment 2)

Figure 4:
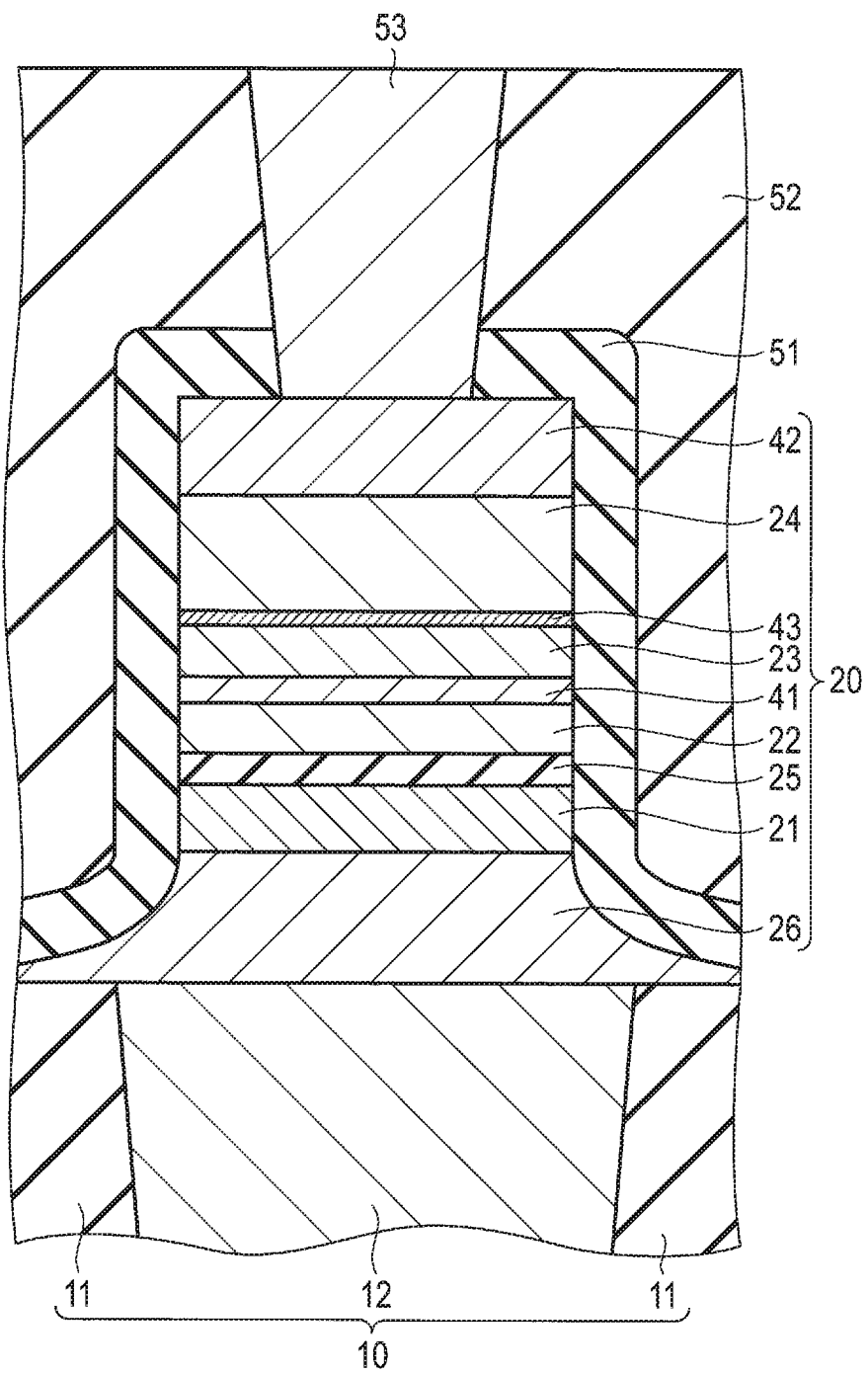
FIG. 4 is a cross-sectional view schematically showing the structure of a magnetic memory device according to a second embodiment.

FIG. 4 is a cross-sectional view schematically showing the structure of a magnetic memory device (semiconductor integrated circuit device) according to a second embodiment. As the basic structure is similar to that of the first embodiment, the matters described in the first embodiment are omitted.

The structure of a lower region 10 is the same as that of the first embodiment. A stacked structure 20 for a magnetoresistive element is provided on the lower region 10.

The stacked structure 20 includes a first magnetic layer 21, a second magnetic layer 21, a third magnetic layer 23, a fourth magnetic layer 24, a nonmagnetic layer 25, an under layer 26, a conductive oxide layer 41, a second conductive oxide layer 42 and an intermediate layer 43.

Specifically, the first magnetic layer 21 is provided between the lower region 10 and the conductive oxide layer 41. The second magnetic layer 22 is provided between the conductive oxide layer 41 and the first magnetic layer 21. The nonmagnetic layer 25 is provided between the first magnetic layer 21 and the second magnetic layer 22. The conductive oxide layer 41 is provided between the second magnetic layer 22 and the third magnetic layer 23. The third magnetic layer 23 is provided between the conductive oxide layer 41 and the second conductive oxide layer 42 and between the conductive oxide layer 41 and the fourth magnetic layer 24. The fourth magnetic layer 24 is provided between the third magnetic layer 23 and the second conductive oxide layer 42. The under layer 26 is provided between the lower region 10 and the first magnetic layer 21. The intermediate layer 43 is provided between the third magnetic layer 23 and the fourth magnetic layer 24.

The functions and constituent materials of the first magnetic layer 21, the second magnetic layer 22, the third magnetic layer 23, the fourth magnetic layer 24, the nonmagnetic layer 25 and the under layer 26 are the same as those of the first embodiment. Specifically, the first magnetic layer 21 is used as a storage layer. The second magnetic layer 22 is used as a part of a reference layer. The third magnetic layer 23 is used as a part of the reference layer. The fourth magnetic layer 24 is used as a shift canceling layer. The nonmagnetic layer 25 is used as a tunnel barrier layer.

The conductive oxide layer 41 is provided between the second magnetic layer 22 and the third magnetic layer 23 and is formed of a conductive oxide containing boron (B). Specifically, the conductive oxide layer 41 is formed of a conductive metal oxide containing boron (B). The same material as the material used for the conductive oxide layer 31 of the first embodiment can be used for the conductive oxide layer 41.

The second conductive oxide layer 42 is used as the cap layer of the magnetoresistive element and is formed of a conductive oxide containing boron (B). Specifically, the second conductive oxide layer 42 is formed of a conductive metal oxide containing boron (B). The same material as the material used for the conductive oxide layer 31 of the first embodiment can be used for the second conductive oxide layer 42.

The intermediate layer 43 is used as an SAF coupling layer between the third magnetic layer 23 and the fourth magnetic layer 24. The same material as the material used for the intermediate layer 33 of the first embodiment can be used for the intermediate layer 43.

The stacked structure 20 is covered with a protective insulating film 51. The protective insulating film 51 is covered with an interlayer insulating film 52. A top electrode 53 is provided in the hole formed in the protective insulating film 51 and the interlayer insulating film 52.

The basic function and operation of the magnetoresistive element in the above magnetic memory device are similar to those of the magnetoresistive element of the first embodiment.

Now, this specification explains a method for manufacturing the magnetic memory device of the present embodiment with reference to FIG. 4 to FIG. 7.

Figure 5:
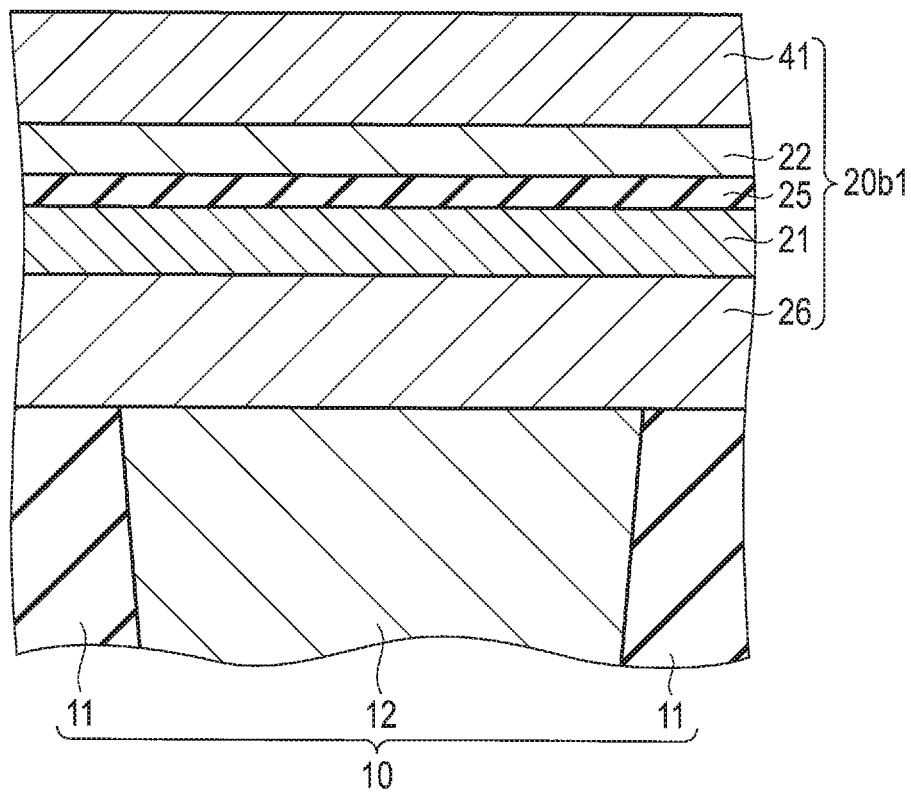
FIG. 5 is a cross-sectional view schematically showing a part of a method for manufacturing the magnetic memory device according to the second embodiment.

As shown in FIG. 5, for example, a MOS transistor (not shown), an interlayer insulating film 11 and a bottom electrode 12 are formed on a semiconductor substrate (not shown). In this way, the lower region 10 is formed.

Subsequently, a stacked film 20b1 for a magnetoresistive element is formed on the lower region 10. A method for forming the stacked film 20b1 is explained below.

The under layer 26 is formed on the lower region 10 by sputtering. For example, ruthenium (Ru), tantalum (Ta) or tungsten (W) is used for the material of the under layer 26.

Subsequently, the first magnetic layer 21 to be a storage layer is formed on the under layer 26 by sputtering. Specifically, as the first magnetic layer 21, a CoFeB layer having a thickness of approximately 1 to 1.5 nm is formed.

Subsequently, the nonmagnetic layer 25 to be a tunnel barrier layer is formed on the first magnetic layer 21 by sputtering. Specifically, as the nonmagnetic layer 25, an MgO layer having a thickness of approximately 1 nm is formed.

Subsequently, the second magnetic layer 22 to be a part of a reference layer is formed on the nonmagnetic layer 25 by sputtering. Specifically, as the second magnetic layer 22, a CoFeB layer having a thickness of approximately 1 to 3 nm is formed.

Subsequently, the conductive oxide layer (conductive metal oxide layer) 41 is formed on the second magnetic layer 22 by sputtering. Specifically, the conductive oxide layer 41 containing at least one metal element, selected from indium (In), zinc (Zn) and tin (Sn) is formed. For example, an ITO layer or IGZO layer is formed as the conductive oxide layer 31. Alternatively, a transition metal oxide layer doped with a metal element (Nb, Ta, W, Li, etc.,) or a rare earth metal oxide layer doped with a metal element (In, Li, etc.,) may be formed as the conductive oxide layer 31.

Subsequently, heat treatment is performed. Specifically, heat treatment is performed by PTA in a vacuum at a temperature of approximately 350 to 450° C. for approximately 30 to 180 seconds. By this heat treatment, for example, the first and second magnetic layers are crystallized. The boron (B) contained in the second magnetic layer 22 is diffused into the conductive oxide layer 41. As a result, the conductive oxide layer 41 contains boron (B). As the conductive oxide layer 41 is adjacent to the second magnetic layer 22, the boron (B) contained in the second magnetic layer 22 can be effectively diffused into the conductive oxide layer 41.

Figure 6:
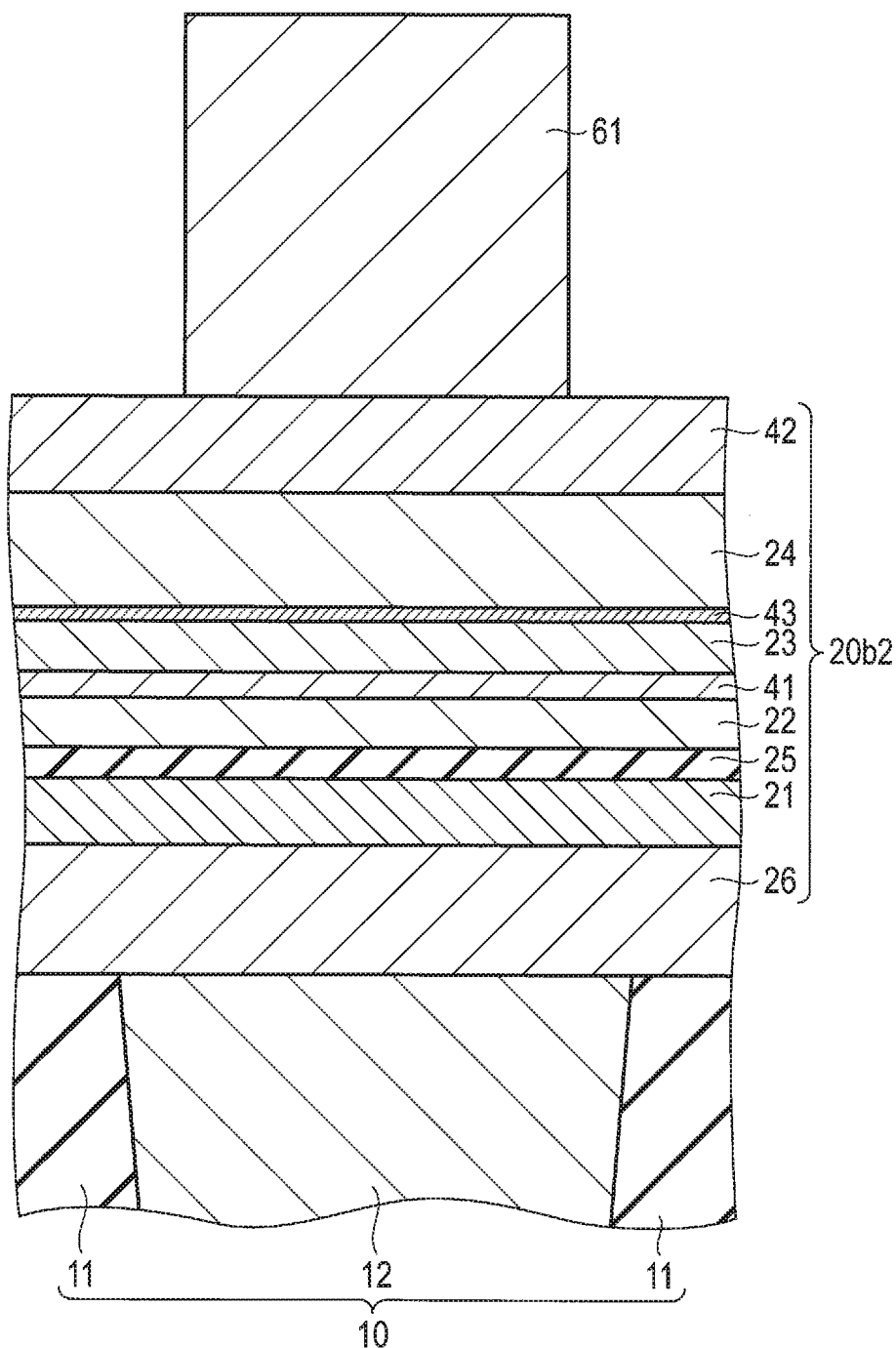
FIG. 6 is a cross-sectional view schematically showing a part of the method for manufacturing the magnetic memory device according to the second embodiment.

Subsequently, as shown in FIG. 6, the thickness of the conductive oxide layer 41 containing boron (B) is reduced by dry etching.

Subsequently, the third magnetic layer 23 to be a part of the reference layer is formed on the conductive oxide layer 41 having the reduced thickness by sputtering. Specifically, for example, a multilayer of Co/Pt, Co/Ni or Co/Pd is formed as the third magnetic layer 23. The multilayer has an approximately 3 to 5 periodic structure. At this time, the magnetic coupling between the second magnetic layer 22 and the third magnetic layer 23 should be adequately obtained. Specifically, the thickness of the conductive oxide layer 41 is sufficiently reduced to adequately obtain the magnetic coupling between the second magnetic layer 22 and the third magnetic layer 23.

Subsequently, the intermediate layer 43 is formed on the third magnetic layer 23 by sputtering. Specifically, as the intermediate layer 43, a ruthenium (Ru) layer having a thickness of approximately 0.4 to 0.8 nm is formed.

Subsequently, the fourth magnetic layer 24 to be a shift canceling layer is formed on the intermediate layer 43 by sputtering. Specifically, for example, a multilayer of Co/Pt, Co/Ni or Co/Pd is formed as the fourth magnetic layer 24. The multilayer has an approximately 10 to 15 periodic structure.

Subsequently, the second conductive oxide layer (conductive metal oxide layer) 42 to be a cap layer is formed on the fourth magnetic layer 24 by sputtering. Specifically, the conductive oxide layer 42 containing at least one metal element selected from indium (In), zinc (Zn) and tin (Sn) is formed. For example, an ITO layer or IGZO layer is formed as the conductive oxide layer 42. Alternatively, a transition metal oxide layer doped with a metal element (Nb, Ta, W, Li, etc.,) or a rare earth metal oxide layer doped with a metal element (In, Li, etc.,) may be formed as the conductive oxide layer 42. As long as the damage caused to the element by etching the upper part of the sides of the element is acceptable in the subsequent process, instead of the conductive oxide layer 42, a metal layer such as a tantalum (Ta) layer or ruthenium (Ru) layer may be used.

In the above manner, a stacked film 20b2 for a magnetoresistive element is formed on the lower region 10.

Subsequently, a hard mask 61 is formed on the conductive oxide layer 42 of the stacked film 20b2. The specific material and forming method of the hard mask 61 are the same as those of the first embodiment.

Figure 7:
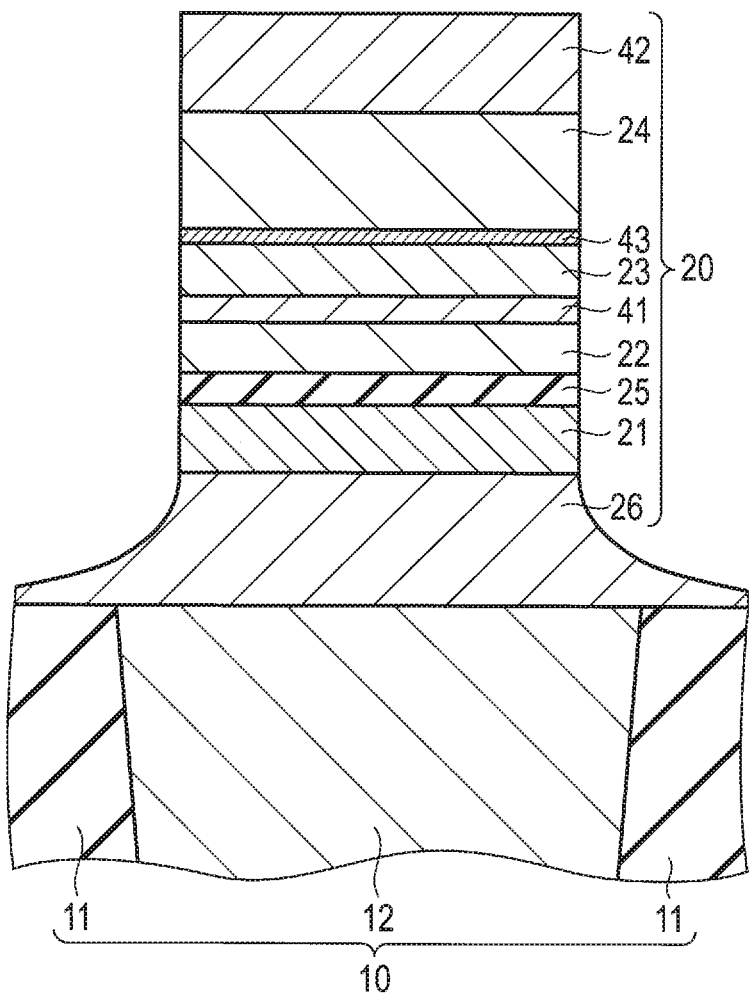
FIG. 7 is a cross-sectional view schematically showing a part of the method for manufacturing the magnetic memory device according the second embodiment.

Subsequently, as shown in FIG. 7, the stacked film 20b2 is etched by using the hard mask 61 shown in FIG. 6 as a mask. Specifically, the stacked film 20b2 is etched by IBE. At this time, the hard mask 61 is also etched. By this process, the stacked structure 20 is formed.

Subsequently, as shown in FIG. 4, in a manner similar to that of the first embodiment, the protective insulating film 51 covering the stacked structure 20 is formed, and the interlayer insulating film 52 covering the protective insulating film 51 is formed. Subsequently, a hole reaching the second conductive oxide layer 42 is formed in the protective insulating film 51 and the interlayer insulating film 52. Further, the top electrode 53 is formed in the hole. In this manner, the magnetic memory device shown in FIG. 4 is obtained. Instead of forming the top electrode 53 in the hole, the upper surface of the element may be exposed by CMP or dry etch-back such that the top electrode 53 is in contact with the exposed upper surface.

As described above, in the present embodiment, the conductive oxide layer 41 is formed on the second magnetic layer 22 functioning as a part of the reference layer. For this reason, in heat treatment, the boron (B) contained in the second magnetic layer 22 can be effectively absorbed by the conductive oxide layer 41, and thus, the crystallinity of the second magnetic layer 22 can be improved. In the conductive oxide layer 41, a predetermined element such as a metal element and oxygen are bonded tightly together. Thus, it is possible to prevent the diffusion of the predetermined element from the conductive oxide layer 41 to the second magnetic layer 22. In this way, the degradation of the second magnetic layer 22 caused by the predetermined element can be prevented. In the present embodiment, the characteristics of the second magnetic layer 22 can be improved, and a magnetoresistive element having excellent characteristics can be obtained.

In the present embodiment, as the boron (B) contained in the second magnetic layer 22 is absorbed by the conductive oxide layer 41, the amount of boron (B) diffused to the sides of the second magnetic layer 22 can be decreased. Thus, it is possible to prevent the accumulation of boron (B) near the sides of the second magnetic layer 22.

In the present embodiment, the second conductive oxide layer 42 Is used as the cap layer of the stacked structure 20. Thus, in a manner similar to that of the first embodiment, it is unnecessary to provide a hole in the cap layer (second conductive oxide layer 42). It is possible to assuredly and easily obtain electrical connection between the top electrode 53 and the fourth magnetic layer 24 via the second conductive oxide layer 42.

In the present embodiment, as the second conductive oxide layer 42 is used as the cap layer of the stacked structure 20, high etching resistance properties can be obtained by the second conductive oxide layer 42 when the stacked structure 20 is formed by etching the stacked film 20b2. Thus, the stacked structure 20 can be appropriately formed in a manner similar to that of the first embodiment.

In the present embodiment, a conductive oxide layer may be used for the under layer 26 such that boron (B) is absorbed from the first magnetic layer 21. In this way, the crystallinity of the first magnetic layer 21 can be improved.

(Embodiment 3)

Figure 8:
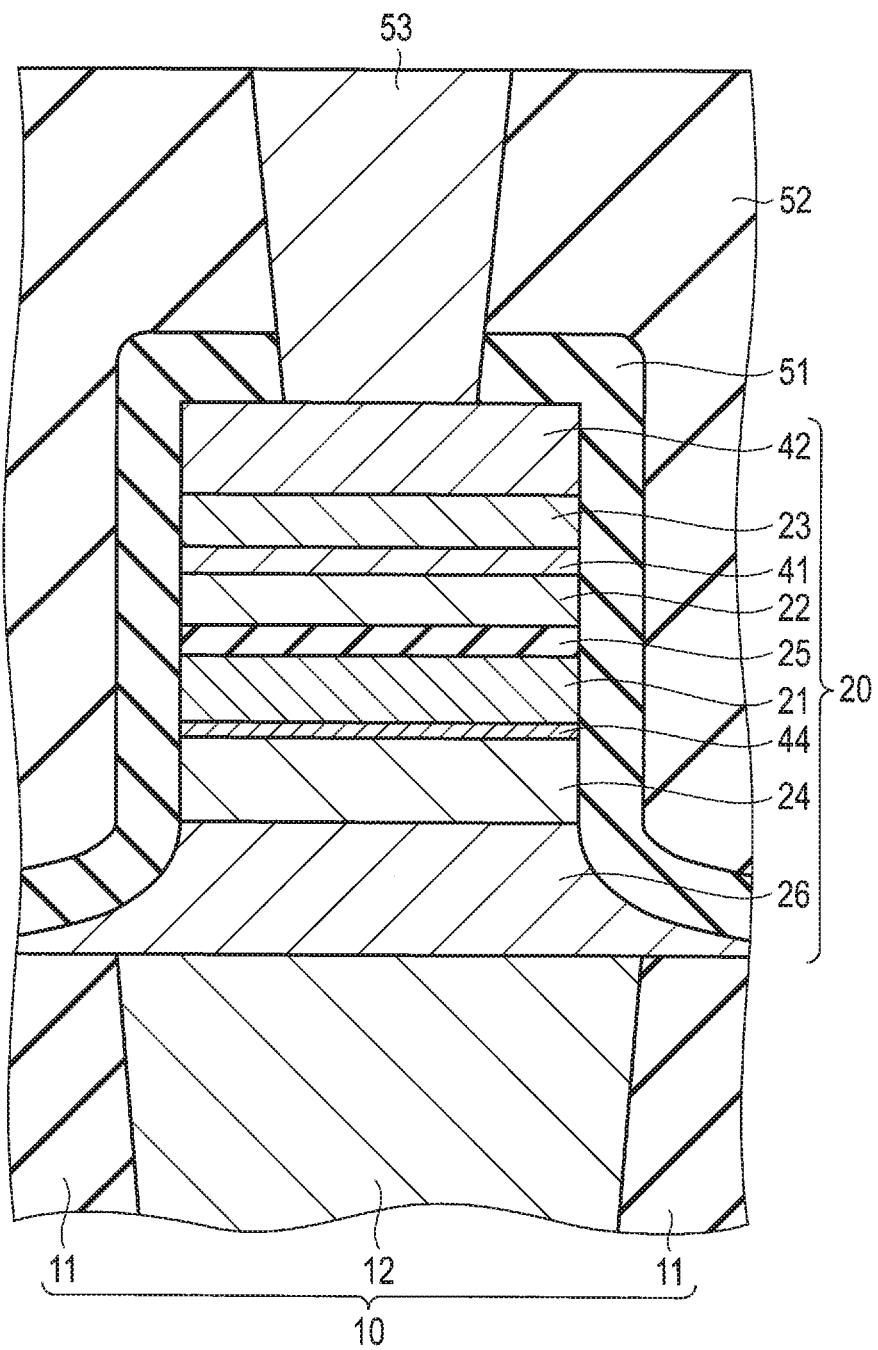
FIG. 8 is a cross-sectional view schematically showing the structure of a magnetic memory device according to a third embodiment.

FIG. 8 is a cross-sectional view schematically showing the structure of a magnetic memory device (semiconductor integrated circuit device) according to a third embodiment. As the basic structure is similar to that of the first and second embodiments, the matters described in the first and second embodiments are omitted.

The structure of a lower region 10 is the same as that of the first embodiment. A stacked structure 20 for a magnetoresistive element is provided on the lower region 10.

The stacked structure 20 includes a first magnetic layer 21, a second magnetic layer 22, a third magnetic layer 23, a fourth magnetic layer 24, a nonmagnetic layer 25, an under layer 26, a conductive oxide layer 41, a second conductive oxide layer 42 and an intermediate layer 44.

Specifically, the first magnetic layer 21 is provided between the lower region 10 and the conductive oxide layer 41. The second magnetic layer 22 is provided between the conductive oxide layer 41 and the first magnetic layer 21. The nonmagnetic layer 25 is provided between the first magnetic layer 21 and the second magnetic layer 22. The conductive oxide layer 41 is provided between the second magnetic layer 22 and the third magnetic layer 23. The third magnetic layer 23 is provided between the conductive oxide layer 41 and the second conductive oxide layer 42. The fourth magnetic layer 24 is provided between the lower region 10 and the first magnetic layer 21. The under layer 26 is provided between the lower region 10 and the fourth magnetic layer 24. The intermediate layer 44 is provided between the first magnetic layer 21 and the fourth magnetic layer 24.

The functions and constituent materials of the first magnetic layer 21, the second magnetic layer 22, the third magnetic layer 23, the fourth magnetic layer 24, the nonmagnetic layer 25 and the under layer 26 are the same as those of the first embodiment. Specifically, the first magnetic layer 21 is used as a storage layer. The second magnetic layer 22 is used as a part of a reference layer. The third magnetic layer 23 is used as a part of the reference layer. The fourth magnetic layer 24 is used as a shift canceling layer. The nonmagnetic layer 25 is used as a tunnel barrier layer.

The conductive oxide layer 41 is provided between the second magnetic layer 22 and the third magnetic layer 23 and is formed of a conductive oxide containing boron (B). Specifically, the conductive oxide layer 41 is formed of a conductive metal oxide containing boron (B). The same material as the material used for the conductive oxide layer 31 of the first embodiment can be used for the conductive oxide layer 41.

The second conductive oxide layer 42 is used as the can layer of the magnetoresistive element and is formed of a conductive oxide containing boron (B). Specifically, the second conductive oxide layer 42 is formed of a conductive metal oxide containing boron (B). The same material as the material used for the conductive oxide layer 31 of the first embodiment can be used for the second conductive oxide layer 42.

The intermediate layer 44 is used as a diffusion barrier layer between the first magnetic layer 21 and the fourth magnetic layer 24. For example, a tantalum (Ta) layer is used for the intermediate layer 44.

The stacked structure 20 is covered with a protective insulating film 31. The protective insulating film is covered with an interlayer insulating film 52. A top electrode 53 is provided in the hole formed in the protective insulating film 51 and the interlayer insulating film 52.

The basic function and operation of the magnetoresistive element in the above magnetic memory device are similar to those of the magnetoresistive element of the first embodiment.

Now, this specification explains a method for manufacturing the magnetic memory device of the present embodiment with reference to FIG. 8 to FIG. 11.

Figure 9:
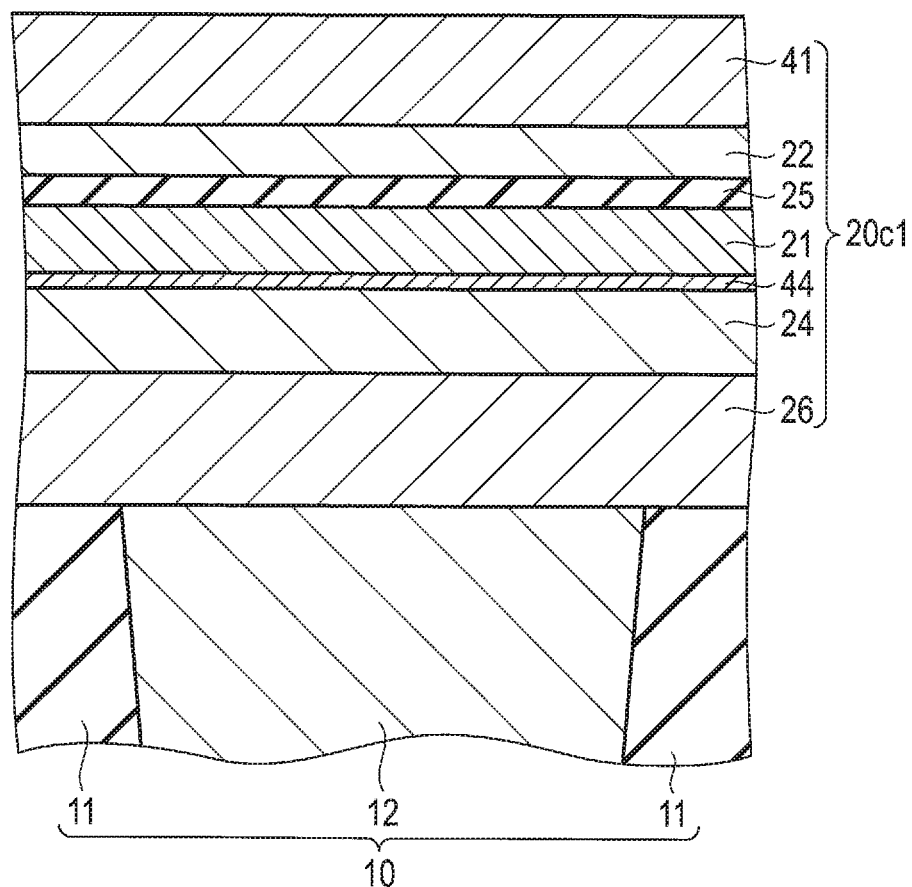
FIG. 9 is a cross-sectional view schematically showing a part of a method for manufacturing the magnetic memory device according to the third embodiment.

As shown in FIG. 9, for example, a MOS transistor (not shown), an interlayer insulating film 11 and a bottom electrode 12 are formed on a semiconductor substrate (not shown). In this way, the lower region 10 is formed.

Subsequently, a stacked film 20c1 for a magnetoresistive element is formed on the lower region 10. A method for forming the stacked film 20c1 is explained below.

The under layer 26 is formed on the lower region 10 by sputtering. For example, ruthenium (Ru), tantalum (Ta) or tungsten (W) is used for the material of the under layer 26.

Subsequently, the fourth magnetic layer 24 to be a shift canceling layer is formed on the under layer 26 by sputtering. Specifically, for example, a multilayer of Co/Pt, Co/Ni or Co/Pd is formed as the fourth magnetic layer 24. The multilayer has an approximately 10 periodic structure.

Subsequently, the intermediate layer 44 is formed on the fourth magnetic layer 24 by sputtering. Specifically, a tantalum (Ta) layer is formed as the intermediate layer 44.

Subsequently, the first magnetic layer 21 to be a storage layer is formed on the intermediate layer 44 by sputtering. Specifically, as the first magnetic layer 21, a CoFeB layer having a thickness of approximately 1 to 1.5 nm is formed.

Subsequently, the nonmagnetic layer 25 to be a tunnel barrier layer is formed on the first magnetic layer 21 by sputtering. Specifically, as the nonmagnetic layer 25, an MgO layer having a thickness of approximately 1 nm is formed.

Subsequently, the second magnetic layer 22 to be a part of the reference layer is formed on the nonmagnetic layer 25 by sputtering. Specifically, as the second magnetic layer 22, a CoFeB layer having a thickness of approximately 1 to 1.5 nm is formed.

Subsequently, the conductive oxide layer (conductive metal oxide layer) 41 is formed on the second magnetic layer 22 by sputtering. Specifically, the conductive oxide layer 41 containing at least one metal element selected from indium (In), zinc (Zn) and tin (Sn) is formed. For example, an ITO layer or IGZO layer is formed as the conductive oxide layer 41. Alternatively, a transition metal oxide layer doped with a metal element (Nb, Ta, W, Li, etc.,) or a rare earth metal oxide layer doped with a metal element (In, Li, etc.,) may be formed as the conductive oxide layer 41.

Subsequently, heat treatment is performed. Specifically, heat treatment is performed by RTA in a vacuum at a temperature of approximately 350 to 450° C. for approximately 30 to 180 seconds. By this heat treatment, for example, the first and second magnetic layers are crystallized. The boron (B) contained in the second magnetic layer 22 is diffused into the conductive oxide layer 41. As a result, the conductive oxide layer 41 contains boron (B). As the conductive oxide layer 41 is adjacent to the second magnetic layer 22, the boron (B) contained in the second magnetic layer 22 can be effectively diffused into the conductive oxide layer 41.

Figure 10:
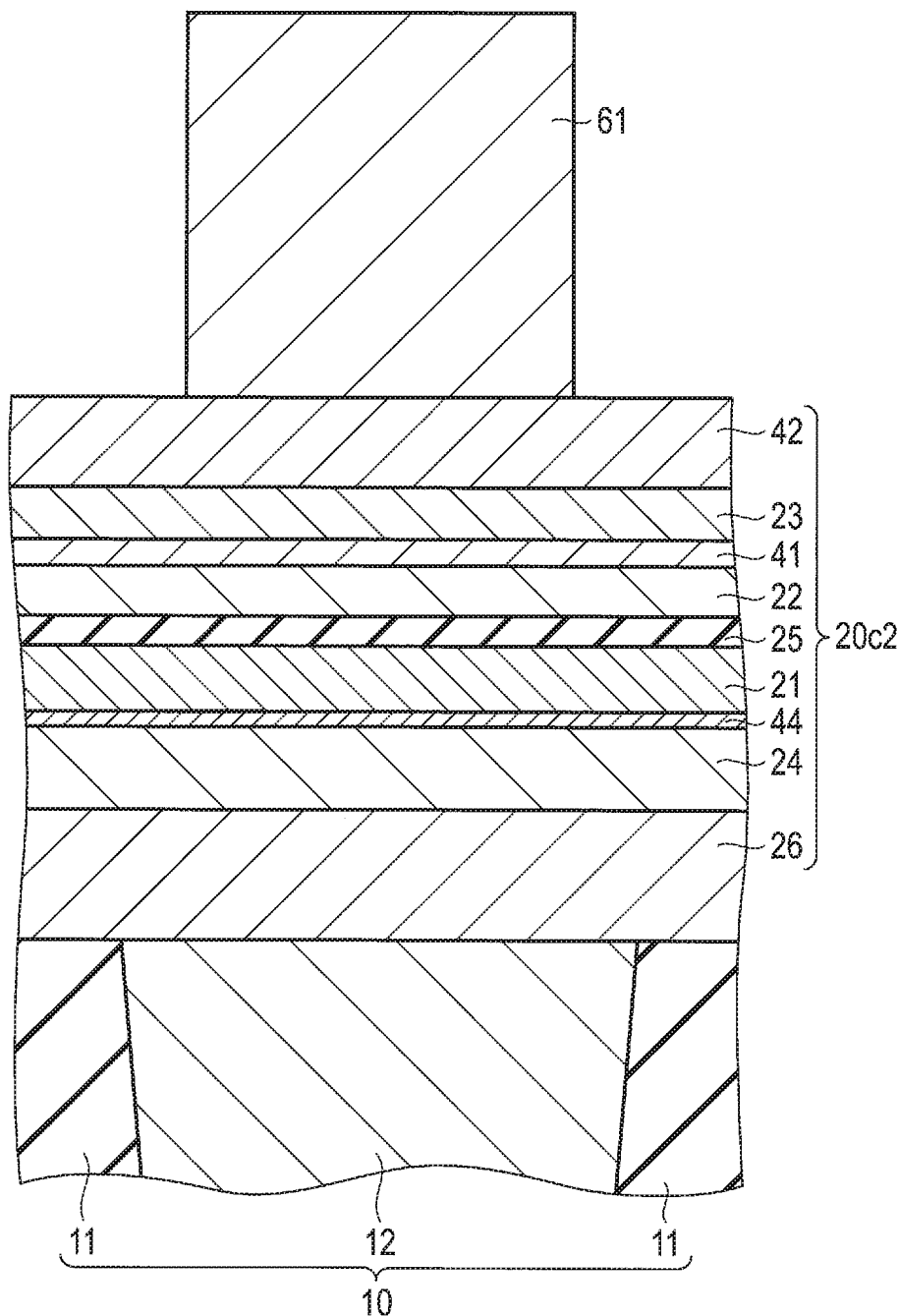
FIG. 10 is a cross-sectional view schematically showing a part of the method for manufacturing the magnetic memory device according to the third embodiment.

Subsequently, as shown in FIG. 10, the thickness of the conductive oxide layer 41 containing boron (B) is reduced by dry etching.

Subsequently, the third magnetic layer 23 to be a part of the reference layer is formed on the conductive oxide layer 41 having the reduced thickness by sputtering. Specifically, for example, a multilayer of Co/Pt, Co/Ni or Co/Pd is formed as the third magnetic layer 23. The multilayer has an approximately 3 to 5 periodic structure. At this time, the magnetic coupling between the second magnetic layer 22 and the third magnetic layer 23 should be adequately obtained. Specifically, the thickness of the conductive oxide layer 41 is sufficiently reduced to adequately obtain the magnetic coupling between the second magnetic layer 22 and the third magnetic layer 23.

Subsequently, the second conductive oxide layer (conductive metal oxide layer) 42 to be a cap layer is formed on the third magnetic layer 23 by sputtering. Specifically, the second conductive oxide layer 42 containing at least one metal element selected from indium (In), zinc (Zn) and tin (Sn) is formed. For example, an ITO layer or IGZO layer is formed as the second conductive oxide layer 42. Alternatively, a transition metal oxide layer doped with a metal element (Nb, Ta, Li, etc.,) or a rare earth metal oxide layer doped with a metal element (In, Li, etc.,) may be formed as the second conductive oxide layer 42.

In the above manner, a stacked film 20c2 for a magnetoresistive element is formed on the lower region 10.

Subsequently, a hard mask 61 is formed on the second conductive oxide layer 42 of the stacked film 20c2. The specific material and forming method of the hard mask 61 are the same as those of the first embodiment.

An intermediate layer (for example, an Ru layer) may be formed as an SAF coupling layer on the third magnetic layer 23. A fifth magnetic layer (for example, a multilayer of Co/Pt, Co/Ni or Co/Pd) may be formed as the shift canceling layer on the intermediate layer. In this case, the second conductive oxide layer 42 is formed on the fifth magnetic layer.

Figure 11:
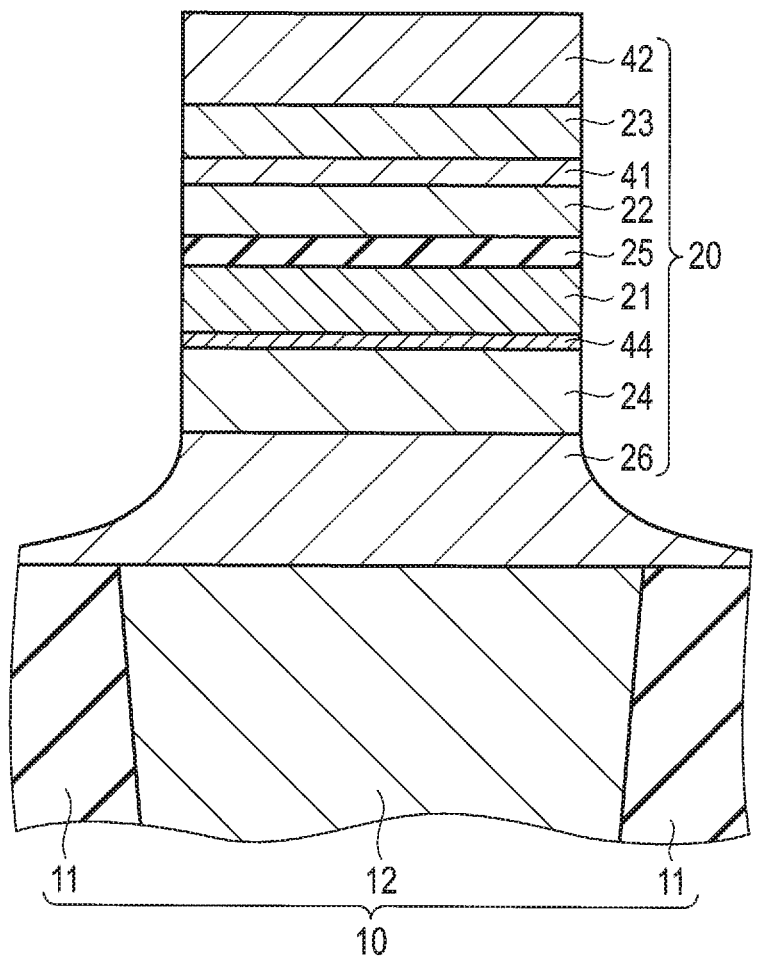
FIG. 11 is a cross-sectional view schematically showing a part of the method for manufacturing the magnetic memory device according to the third embodiment.

Subsequently, as shown in FIG. 11, the stacked film 20c2 is etched by using the hard mask 61 shown in FIG. 10 as a mask. Specifically, the stacked film 20c2 is etched by IBE. At this time, the hard mask 61 is also etched. By this process, the stacked structure 20 is formed.

Subsequently, as shown in FIG. 8, in a manner similar to that of the first embodiment, the protective insulating film 51 covering the stacked structure 20 is formed, and the interlayer insulating film 52 covering the protective insulating film 51 is formed. Subsequently, a hole reaching the second conductive oxide layer 42 is formed in the protective insulating film 51 and the interlayer insulating film 52. Further, the top electrode 53 is formed in the hole. In this manner, the magnetic memory device shown in FIG. 8 is obtained.

As described above, in the present embodiment, the conductive oxide layer 41 is formed on the second magnetic layer 22 functioning as a part of the reference layer. For this reason, in heat treatment, the boron (B) contained in the second magnetic layer 22 can be effectively absorbed by the conductive oxide layer 41, and thus, the crystallinity of the second magnetic layer 22 can be improved. In the conductive oxide layer 41, a predetermined element such as a metal element and oxygen are bonded tightly together. Thus, it is possible to prevent the diffusion of the predetermined element from the conductive oxide layer 41 to the second magnetic layer 22. In this way, the degradation of the second magnetic layer 22 caused by the predetermined element can be prevented. In the present embodiment, the characteristics of the second magnetic layer 22 can be improved, and a magnetoresistive element having excellent characteristics can be obtained.

In the present embodiment, as the boron (B) contained in the second magnetic layer 22 is absorbed by the conductive oxide layer 41, the amount of boron (B) diffused to the sides or the second magnetic layer 22 can be decreased. Thus, it is possible to prevent the accumulation of boron (B) near the sides of the second magnetic layer 22.

In the present embodiment, the second conductive oxide layer 42 is used as the cap layer of the stacked structure 20. Thus, in a manner similar to that of the first embodiment, it is unnecessary to provide a hole in the cap layer (second conductive oxide layer 42). It is possible to assuredly and easily obtain electrical connection between the top electrode 53 and the third magnetic layer 23 via the second conductive oxide layer 42.

In the present embodiment, as the second conductive oxide layer 42 is used as the cap layer of the stacked structure 20, high etching resistance properties can be obtained by the second conductive oxide layer 42 when the stacked structure 20 is formed by etching the stacked film 20c2. Thus, the stacked structure 20 can be appropriately formed in a manner similar to that of the first embodiment.

Figure 12:
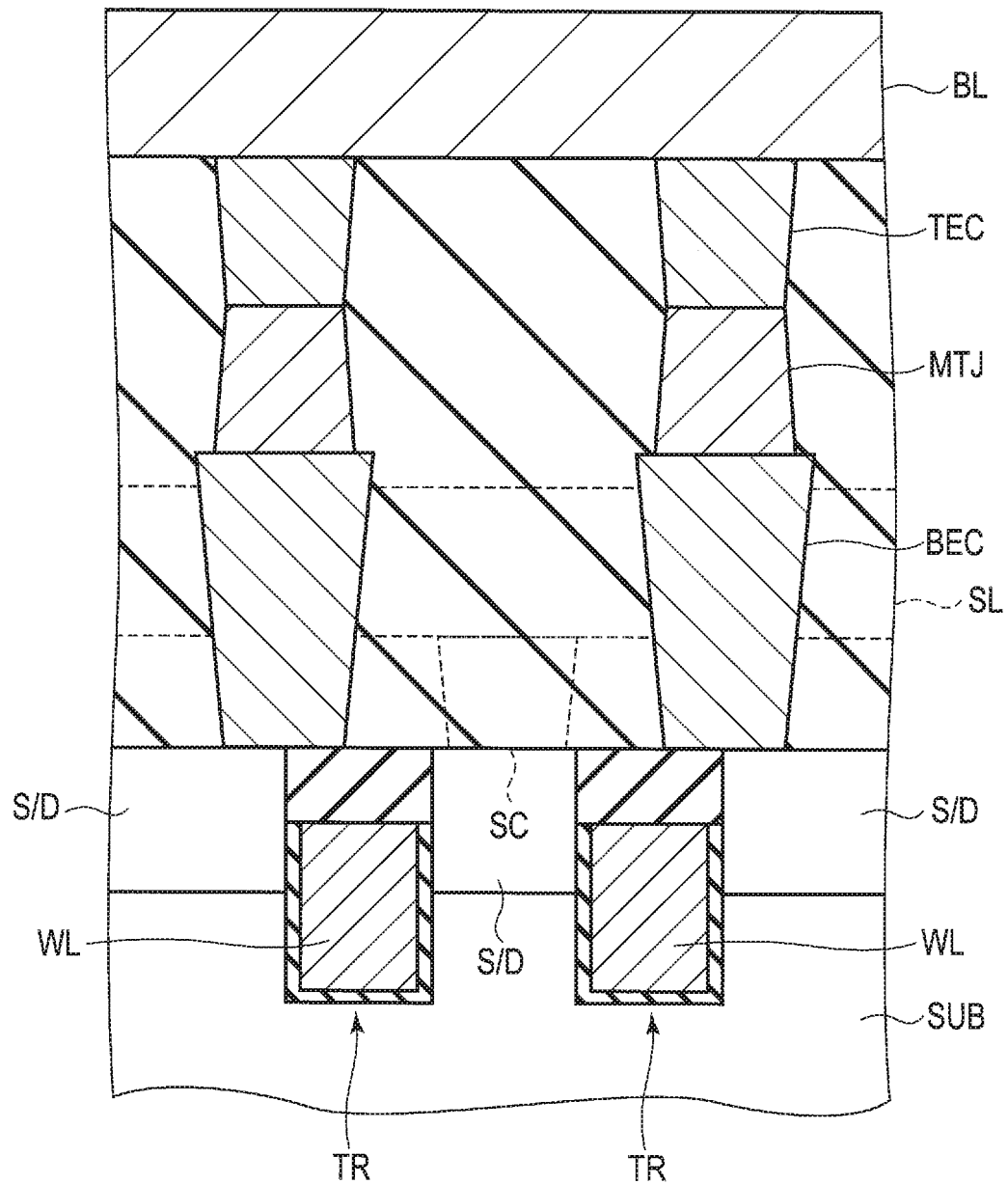
FIG. 12 is a cross-sectional view schematically showing an example of the general structure of a semiconductor integrated circuit device to which the magnetoresistive elements shown in the first, second and third embodiments are applied.

FIG. 12 is a cross-sectional view schematically showing an example of the general structure of a semiconductor integrated circuit device to which the magnetoresistive elements shown in the first, second and third embodiments are applied.

A buried-gate MOS transistor TR is formed in a semiconductor substrate SUB. The gate electrode of the MOS transistor TR is used as a word line WL. A bottom electrode BEC is connected to one of the source/drain regions S/D of the MOS transistor TR. A source line contact SC is connected to the other source/drain region S/D.

A magnetoresistive element MTJ is formed on the bottom electrode BEC. A top electrode TEC is formed on the magnetoresistive element MTJ. A bit line BL is connected to the top electrode TEC. A source line SL is connected to the source line contact SC.

When the magnetoresistive elements explained in the first, second and third embodiments are applied to the semiconductor integrated circuit device shown in FIG. 12, the semiconductor integrated circuit device can exert an excellent effect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
    a lower region; and
    a stacked structure provided on the lower region, wherein the stacked structure includes:
        a conductive oxide layer containing boron (B);
        a first magnetic layer provided between the lower region and the conductive oxide layer, having a variable magnetization direction, and containing iron (Fe) and boron (B);
        a second magnetic layer provided between the lower region and the first magnetic layer, having a fixed magnetization direction, and containing iron (Fe) and boron (B); and
        a nonmagnetic layer provided between the first magnetic layer and the second magnetic layer,
    wherein the conductive oxide layer contains at least one element selected from transition metal elements and rare earth metal elements, and
    wherein the conductive oxide layer is doped with a predetermined metal element selected from niobium (Nb), tantalum (Ta), tungsten (W), lithium (Li) and indium (In).

2. The device of claim 1, wherein the stacked structure further includes a third magnetic layer provided between the lower region and the second magnetic layer, having a fixed magnetization direction parallel to the magnetization direction of the second magnetic layer, and containing cobalt (Co) and at least one element selected from platinum (Pt), nickel (Ni) and palladium (Pd).

3. The device of claim 2, wherein the stacked structure further includes a fourth magnetic layer provided between the lower region and the third magnetic layer, having a fixed magnetization direction antiparallel to the magnetization direction of the second magnetic layer, and containing cobalt (Co) and at least one element selected from platinum (Pt), nickel (Ni) and palladium (Pd).

4. The device of claim 1, wherein:
    the stacked structure further includes a conductive contact layer containing at least one element selected from ruthenium (Ru) and iridium (Ir), and
    the conductive oxide layer is provided between the first magnetic layer and the conductive contact layer.

5. The device of claim 1, wherein the nonmagnetic layer contains magnesium (Mg) and oxygen (O).

6. A magnetic memory device comprising:

a lower region; and a stacked structure provided on the lower region, wherein the stacked structure includes:

- a conductive oxide layer containing boron (B);
- a first magnetic layer provided between the lower region and the conductive oxide layer, having a variable magnetization direction, and containing iron (Fe) and boron (B);
- a second magnetic layer provided between the conductive oxide layer and the first magnetic layer, having a fixed magnetization direction, and containing iron (Fe) and boron (B); and
- a nonmagnetic layer provided between the first magnetic layer and the second magnetic layer, wherein the conductive oxide layer contains at least one element selected from transition metal elements and rare earth metal elements, and wherein the conductive oxide layer is doped with a predetermined metal element selected from niobium (Nb), tantalum (Ta), tungsten (W), lithium (Li) and indium (In).

7. The device of claim 6, wherein:

the stacked structure further includes a third magnetic layer having a fixed magnetization direction parallel to the magnetization direction of the second magnetic layer, and containing cobalt (Co) and at least one element selected from platinum (Pt), nickel (Ni) and palladium (Pd), and the conductive oxide layer is provided between the second magnetic layer and the third magnetic layer.

8. The device of claim 7, wherein:

the stacked structure further includes a second conductive oxide layer, and the third magnetic layer is provided between the conductive oxide layer and the second conductive oxide layer.

9. The device of claim 7, wherein:

the stacked structure further includes a fourth magnetic layer having a fixed magnetization direction antiparallel to the magnetization direction of the second magnetic layer, and containing cobalt (Co) and at least one element selected from platinum (Pt), nickel (Ni) and palladium (Pd), and the third magnetic layer is provided between the conductive oxide layer and the fourth magnetic layer.

10. The device of claim 9, wherein:

the stacked structure further includes a second conductive oxide layer, and the fourth magnetic layer is provided between the third magnetic layer and the second conductive oxide layer.

11. The device of claim 7, wherein the stacked structure further includes a fourth magnetic layer provided between the lower region and the first magnetic layer, having a fixed magnetization direction antiparallel to the magnetization direction of the second magnetic layer, and containing cobalt (Co) and at least one element selected from platinum (Pt), nickel (Ni) and palladium (Pd).

12. The device of claim 6, wherein the nonmagnetic layer contains magnesium (Mg) and oxygen (O).

* * * * *